(12) United States Patent
Zhao et al.

(10) Patent No.: US 6,953,770 B2
(45) Date of Patent: Oct. 11, 2005

(54) $MGB_2$—BASED SUPERCONDUCTOR WITH HIGH CRITICAL CURRENT DENSITY, AND METHOD FOR MANUFACTURING THE SAME

(75) Inventors: Yong Zhao, Urayasu (JP); Yong Feng, Tokyo (JP); Yuan Wu, Urayasu (JP); Takato Machi, Tokyo (JP); Yasunori Fudamoto, Tokyo (JP); Naoki Koshizuka, Narashino (JP); Masato Murakami, Tokyo (JP)

(73) Assignee: International Superconductivity Technology Center, The Juridical Foundation, Tokyo (JP)

( * ) Notice: Subject to any disclaimer, the term of this patent is extended or adjusted under 35 U.S.C. 154(b) by 137 days.

(21) Appl. No.: 10/333,770

(22) PCT Filed: May 10, 2002

(86) PCT No.: PCT/JP02/04568

§ 371 (c)(1),
(2), (4) Date: Jan. 22, 2003

(87) PCT Pub. No.: WO02/098794

PCT Pub. Date: Dec. 12, 2002

(65) Prior Publication Data

US 2004/0092403 A1 May 13, 2004

(30) Foreign Application Priority Data

Jun. 1, 2001 (JP) .................................. 2001-167389

(51) Int. Cl.[7] .......................... H01L 39/00; H01B 1/02; H01B 12/00
(52) U.S. Cl. ...................... 505/124; 428/930; 420/402; 420/901; 423/289
(58) Field of Search .......................... 505/100, 124, 505/230, 430, 433, 490, 500; 428/930; 501/96.1, 96.3, 108; 420/402, 901; 423/155, 289

(56) References Cited

U.S. PATENT DOCUMENTS 6,586,370 B1 * 7/2003 Holcomb ..................... 505/236
6,687,975 B2 * 2/2004 Tomsic ........................ 29/599

FOREIGN PATENT DOCUMENTS

EP          1394112      * 3/2004
WO    WO 02/069353      * 9/2002

OTHER PUBLICATIONS

Zhao et al. "Doping effect of Zr and Ti on the critical current desnity of MgB2 bulk superconductors prepared under ambient pressure", Physica C 378–38, Oct. 2002, pp. 122–126.*

(Continued)

Primary Examiner—Colleen P. Cooke
(74) Attorney, Agent, or Firm—Flynn, Thiel, Boutell & Tanis, P.C.

(57) ABSTRACT

The present invention relates to an $MgB_2$-based superconductor that is easy to manufacture and well suited to mass production, and that exhibits excellent superconducting characteristics (such as a high critical current density) while still retaining the high critical temperature characteristics of $MgB_2$. A powder mixture of magnesium, boron, and titanium is pressed into a pellet, and this product is sintered under an atmospheric pressure and other conditions (preferably at 600° C. or higher) to manufacture an $MgB_2$-based superconductor in which titanium and/or a titanium compound are dispersed in polycrystalline $MgB_2$. The composition of the $MgB_2$-based superconductor is preferably adjusted to have an atomic ratio of Mg:B:Ti=x:2:y, $0.7<x<1.2$ and $0.05<y<0.3$, and more preferably $0.07<y<0.2$, by adjusting the amounts in which the raw materials are added.

12 Claims, 7 Drawing Sheets

OTHER PUBLICATIONS

Cheng et al. "Chemical doping effect on the crystal structure and superconductivity of MgB2", Physica C 386, 2003, pp. 588–592.*

Fu et al. "Microstructures and superconducting properties in Ti–doped MgB2/Ta/Cu tape", Physica C 386, 2003, pp. 659–662.*

Anderson, Jr. et al., "Titanium additives to MgB2 conductors", Physica C 390, 2003, pp. 11–15.*

Superconducting properties of $MgB_2$ bulk materials prepared by high–pressure sintering, by Y. Takano et al, Applied Physics Letters, vol. 78, No. 19, May 2001, pp. 2914–2916.

High critical current density of $MgB_2$ bulk superconductor doped with Ti and sintered at ambient pressure, by Y. Zhao et al, Applied Physics Letters, vol. 79, No. 8, Aug. 2001, pp. 1154–1156.

Enhancement of critical current density in $MgB_2$ bulk superconductor by Ti doping, by Y. Zhao et al, Europhysics Letters, vol. 57, No. 3, Feb. 2002, pp. 437–443.

Improved chemical stability of Ti–doped $MgB_2$ in water, by Y. Zhao et al, Applied Physics Letters, vol. 80, No. 13, Apr. 2002, pp. 2311–2313.

Nanoparticle structure of $MgB_2$ with ultrathin $TiB_2$ grain boundaries, by Y. Zhao et al, Applied Physics Letters, vol. 80, No. 9, Mar. 2002, pp. 1640–1642.

* cited by examiner

MGB$_2$— BASED SUPERCONDUCTOR WITH HIGH CRITICAL CURRENT DENSITY, AND METHOD FOR MANUFACTURING THE SAME

TECHNICAL FIELD

This invention relates to a MgB$_2$-based superconductor that has excellent superconducting characteristics, such as exhibiting a high critical current density, etc., and is easy to manufacture, and to a method for manufacturing this superconductor.

BACKGROUND ART

Metal-based superconductor materials such as NbTi and Nb$_3$Sn are the most common materials today for superconductor wires used in strong magnetic field magnets and so forth. However, because these materials have a very low critical temperature T$_c$, the temperature at which they can be used is limited to the temperature range of liquid helium, and therefore there has been a big problem associated with quenching the superconductors.

In light of this, there has recently been considerable interest in reports pertaining to the superconductor characteristics of MgB$_2$, which is a boride of magnesium, and the utility of MgB$_2$ as a superconductor material has been examined from various angles.

MgB$_2$ is advantageous in terms of quenching because its critical temperature T$_c$ is a relatively high 39K, and the usable temperature is expected to be expanded to 20K, which is higher than that attainable with conventional intermetallic compound superconductors. However, in order to obtain it as a material that exhibits a high critical current density, the material has to be synthesized in a high-pressure atmosphere (such as 40,000 to 60,000 atm) and, therefore, it holds little promise for application as a superconductor material which now needs to be mass produced at a low cost.

An example of articles disclosing the above prior art is that of Y. Takano, H. Takeya, H. Fuji, H. Kumakujira, T. Hatano, K. Togano, H. Kito, and H. Ihara, *Appl. Phys. Lett.*, 78, 2914 (2001).

DISCLOSURE OF THE INVENTION

In light of the above situation, it is an object of the present invention to provide an MgB$_2$-based superconductor that is easy to manufacture and well suited to mass production, and exhibits a high critical current density while still retaining the high critical temperature characteristics of MgB$_2$.

As a result of diligent research aimed at achieving the stated object, the inventors arrived at the finding that although sintering must be performed in a high-pressure atmosphere (40,000 to 60,000 atm) in order to obtain a polycrystalline MgB$_2$ sintered body that exhibits a high critical current density with a conventional method in which a mixed powder of magnesium and boron is used as a sintering powder, if a suitable amount of metallic titanium is added as a sintering aid to magnesium and boron, and the resulting mixed powder is used as the sintering powder, then it is possible to stably obtain a polycrystalline MgB$_2$-based superconductor that exhibits a high critical current density while still retaining its high critical temperature characteristics, even if the sintering is performed in an atmosphere equivalent to an atmospheric pressure.

The present invention was made on the basis of the finding and others, and provides a MgB$_2$-based superconductor and a method for manufacturing the same, as described in (1) to (11) below.

(1) An MgB$_2$-based superconductor with high critical current density, wherein either titanium or a titanium compound or both thereof is dispersed in an MgB$_2$-based sintered body.

(2) The MgB$_2$-based superconductor with high critical current density according to (1) above, wherein either the titanium or the titanium compound or both thereof is present at the MgB$_2$ crystal grain boundary.

(3) The MgB$_2$-based superconductor with high critical current density according to (1) or (2) above, wherein when the amounts of magnesium, boron, and titanium contained in the sintered body are expressed as an atomic ratio of Mg:B:Ti=x:2:y, x and y are such that $0.7<x<1.2$ and $0.05<y<0.3$.

(4) The MgB$_2$-based superconductor with high critical current density according to (1) or (2) above, wherein when the amounts of magnesium, boron, and titanium contained in the sintered body are expressed as an atomic ratio of Mg:B:Ti=x:2:y, x and y are such that $0.7<x<1.2$ and $0.07<y<0.2$.

(5) The MgB$_2$-based superconductor with high critical current density according to any of (1) to (4) above, wherein the superconductor has a critical current density of at least $5\times10^5$ A/cm$^2$ at a temperature of 20K and in a self field.

(6) The MgB$_2$-based superconductor with high critical current density according to any of (1) to (4) above, wherein the superconductor has a critical current density of at least $2\times10^5$ A/cm$^2$ at a temperature of 20K and in a magnetic field of 1 T.

(7) A method for manufacturing the MgB$_2$-based superconductor with high critical current density according to any of (1) to (6) above, the method comprising compacting a mixture of magnesium, boron, and titanium and sintering the pressed mixture.

(8) A method for manufacturing the MgB$_2$-based superconductor with high critical current density according to any of (1) to (6) above, the method comprising forming a mixture of magnesium, boron, and titanium into a wire and firing the wire.

(9) A method for manufacturing the MgB$_2$-based superconductor with high critical current density according to any of (1) to (6) above, the method comprising sintering a mixture of magnesium, boron, and titanium, pulverizing the sintered mixture to powder, forming the powder into a wire and firing the wire.

(10) The method for manufacturing the MgB$_2$-based superconductor with high critical current density according to any of (7) to (9) above, wherein the sintering is performed under an atmospheric pressure.

(11) The method for manufacturing the MgB$_2$-based superconductor with high critical current density according to any of (7) to (10) above, wherein the sintering is performed at a temperature of at least 600° C.

The MgB$_2$-based superconductor of the present invention and the method for manufacturing this superconductor will now be described in specific terms.

According to the manufacturing method of the present invention, a mixture of magnesium, boron, and titanium is pressed into pellets and sintered (fired). Thus, there can be obtained a dense MgB$_2$-based superconductor in which either titanium or a titanium compound or both thereof is dispersed.

FIG. 1 is a schematic diagram illustrating an example of the method for manufacturing the MgB$_2$-based superconductor according to the present invention.

A superconductor bulk material is generally obtained by sintering, while a superconductor wire is obtained by firing, but in this Specification the terms sintering and firing are used interchangeably.

To press the mixture of magnesium, boron, and titanium, a standard pressure of about 50 to 200 MPa should be applied in the manufacture of the sintered body.

When a wire is to be manufactured, the above-mentioned mixture is packed into a metal pipe to form it into a wire, which is then fired. In this case, it is also possible to pulverize a sintered body of a mixture of magnesium, boron, and titanium, and pack the sintered powder thus obtained into a metal pipe to form it into a wire.

The sintering may be conducted at any temperature at which a reaction producing an $MgB_2$-based sintered body (superconductor) will occur, but since the reaction of magnesium (melting point: 650° C.) is accelerated at a temperature of 600° C. or higher, it is preferable that the sintering temperature be at least 600° C. but also be such that the magnesium will not evaporate away.

It is good for the atmosphere during sintering to be a non-oxidative atmosphere (such as an inert gas atmosphere), and from the standpoints of cost and the characteristics of the $MgB_2$-based superconductor obtained, the use of an argon gas atmosphere is recommended.

An atmospheric pressure (an atmosphere pressure equivalent to an atmospheric pressure) is sufficient during sintering, but of course there is no harm if the sintering is performed under high-pressure.

The above-mentioned "$MgB_2$-based superconductor in which either titanium or a titanium compound or both thereof is dispersed" obtained by the manufacturing method of the present invention also encompasses a case in which either titanium or a titanium compound or both thereof is dispersed mostly at the grain boundary of polycrystalline $MgB_2$, but some is also present within the crystal grains.

Because either titanium or a titanium compound or both thereof is dispersed in this polycrystalline $MgB_2$, the $MgB_2$-based superconductor is extremely dense even when sintered at an atmospheric pressure.

With this $MgB_2$-based superconductor, it has been found that the superconducting critical temperature $T_c$ thereof is close to 39K, and the critical current density at a temperature of 20K and in a self-magnetic field is $5 \times 10^5$ A/cm$^2$ or higher, and reaches $2 \times 10^5$ A/cm$^2$ or higher at a temperature of 20K and in a magnetic field of 1 T (with respect to this material, when the amounts of magnesium, boron, and titanium in the $MgB_2$-based superconductor obtained in the examples given below are expressed as an atomic ratio of Mg:B:Ti=x:2:y, the value of x is 0.9 and the value of y is 0.1).

The above-mentioned $MgB_2$-based superconductor obtained by the manufacturing method of the present invention is characterized in that its irreversibility field $H_{irr}$ is closer to an upper critical field $H_{c2}$ than when no titanium is contained.

In general, a superconductor will maintain its superconducting state below the upper critical field $H_{c2}$, but above the irreversibility field $H_{irr}$, the magnetic flux within the superconductor moves, generating resistance, so superconductive current is unable to flow. In other words, if the irreversibility field $H_{irr}$ is close to the upper critical field $H_{c2}$, a large superconducting current can flow even if a high magnetic field is applied, so it is preferable for the irreversibility field $H_{irr}$ to be close to the upper critical field $H_{c2}$, and in this respect the above-mentioned $MgB_2$-based superconductor containing titanium can be considered a preferable material.

The above-mentioned $MgB_2$-based superconductor obtained by the manufacturing method of the present invention is extremely dense because of the titanium and/or titanium compound dispersed therein, even though it is a polycrystalline $MgB_2$ sintered body produced at an atmospheric pressure. This major reason is believed to be that the high critical current density and so forth desired in a superconductor material are exhibited. (Incidentally, when the sintering is performed at an atmospheric pressure without any titanium being added, the resultant sintered body is generally porous and has low density, and the critical current density is also markedly inferior.)

In some cases, the titanium compound present in the polycrystalline $MgB_2$ is $TiB_2$, $TiB_4$, or the like, which are compounds produced during sintering from the titanium added to the raw material mixture, and it seems that these compounds, like titanium, can serve as a pinning center that stops the movement of the lines of magnetic flux without significantly affecting the critical temperature of the $MgB_2$ sintered body, and provide higher critical current density and so on.

In the $MgB_2$-based superconductor according to the present invention, it is preferable for the composition thereof to be adjusted so that when the amounts of magnesium, boron, and titanium are expressed as an atomic ratio of Mg:B:Ti=x:2:y, x and y are within the ranges of $0.7 < x < 1.2$ and $0.05 < y < 0.3$. Adjusting the composition to within these ranges realizes the provision of a superconductor with even better superconducting characteristics (such as critical current density, intensity of magnetization, and irreversibility field). Preferably, if the above-mentioned titanium content y is adjusted to a range of $0.07 < y < 0.2$, the superconducting characteristics will stabilize at an even better level.

The compositional adjustment of the $MgB_2$-based superconductor can be made by adjusting the mixing amounts of the respective raw materials of magnesium, boron, and titanium at the stage of preparing the raw materials.

BEST MODE FOR CARRYING OUT THE INVENTION

As discussed above, the present invention provides an MgB$_2$-based superconductor with excellent superconducting characteristics, without requiring sintering in a high-pressure atmosphere. The present invention will now be described in more specific terms through examples.

EXAMPLE 1

Magnesium powder, boron powder (amorphous), and titanium powder, each having a purity of 99% and a particle size passing through a 300 mesh sieve, were mixed at an atmospheric pressure and pressed into a pellet (green compact) 7 mm in diameter and 6 mm high.

This pellet (green compact) was then placed on an MgO plate inside an electric furnace, and heated first for 1 hour at 600° C. and then for 1 hour at 800° C. in a 1 atm argon gas flow, after which this product was heated for 2 hours at 900° C., and then cooled to room temperature inside the electric furnace. This treatment yielded MgB$_2$-based superconductors (sintered bodies).

Figure 1:
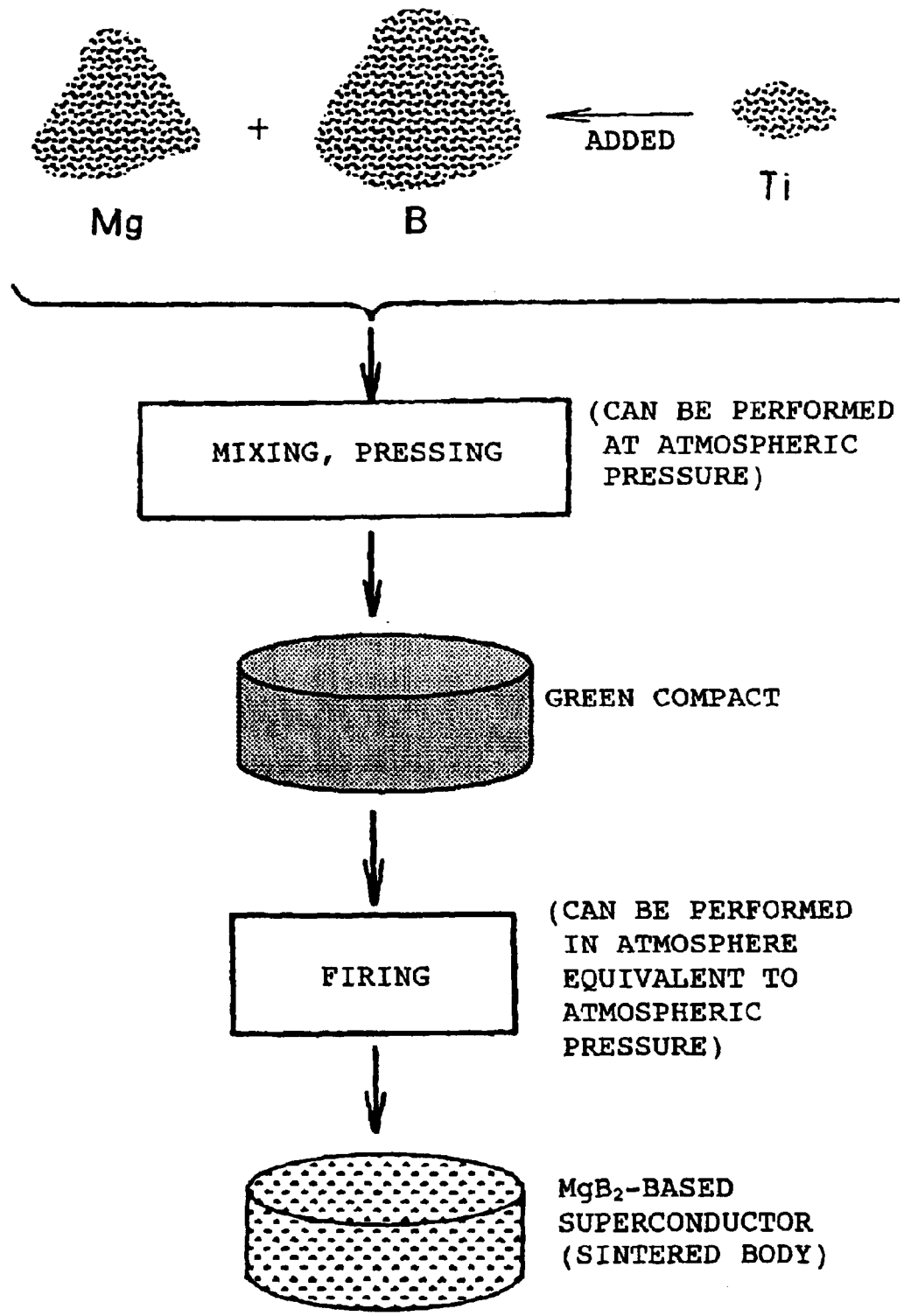
FIG. 1 is a schematic diagram illustrating an example of the method for manufacturing the $MgB_2$-based superconductor according to the present invention.
Figure 2:
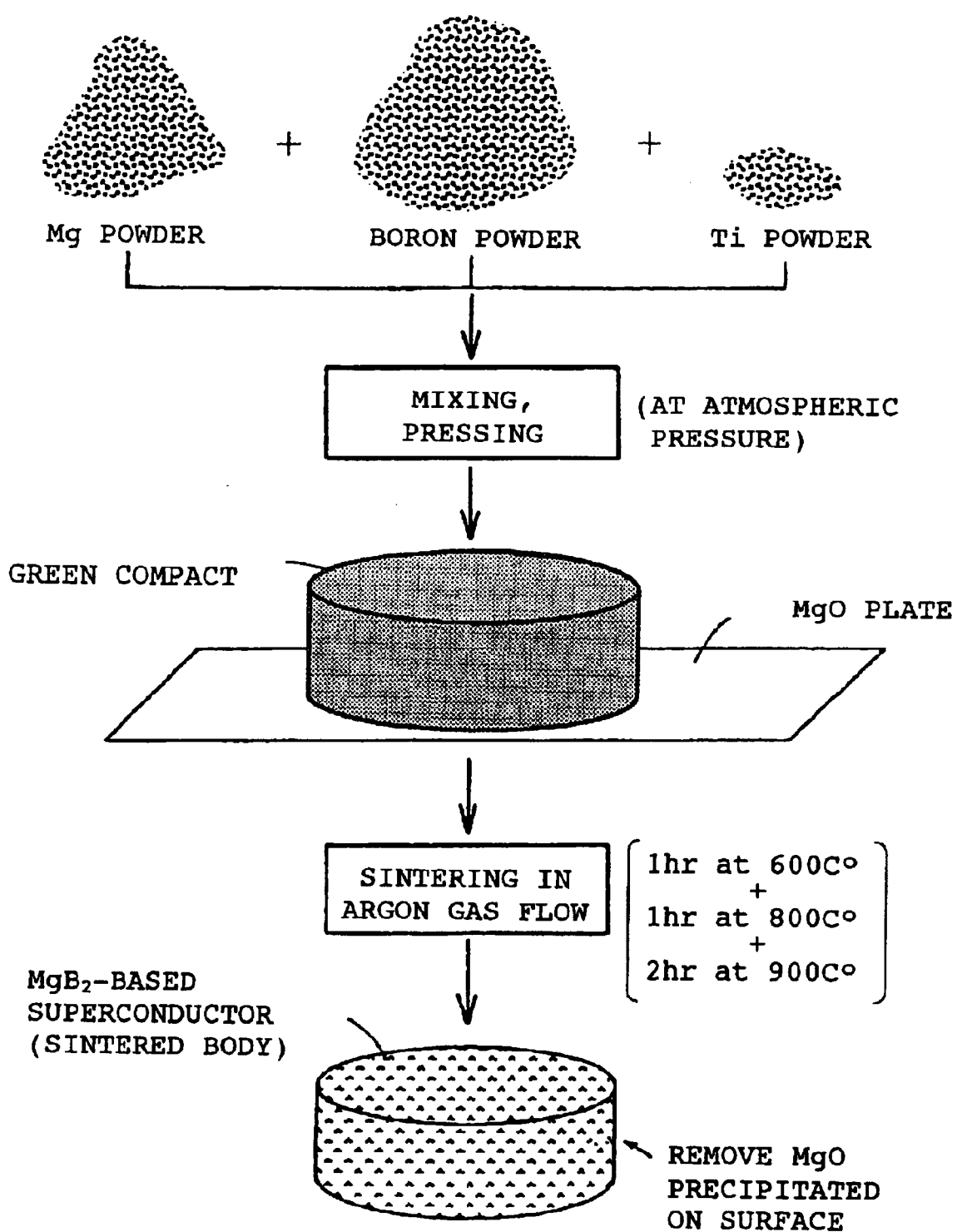
FIG. 2 is a schematic diagram illustrating the treatment steps entailed by the manufacture of an $MgB_2$-based superconductor in examples.

FIG. 2 is a schematic diagram illustrating the treatment steps in this example.

The amounts in which the raw material powders were supplied were adjusted so as to obtain MgB$_2$-based superconductors with various different titanium contents, where the x and y values (x, y) were (1, 0), (0.98, 0.02), (0.95, 0.05), (0.9, 0.1), (0.8, 0.2), (0.6, 0.4), (0.2, 0.8), and (0, 1) when the amounts of magnesium, boron, and titanium were expressed by an atomic ratio of Mg:B:Ti=x:2:y.

The crystallinity of each sample thus produced was evaluated by XRD (X-ray diffraction) and HRTEM (high resolution transmission electron microscope) equipped with EDS (energy dispersion spectroscopy), and as a result it was found that the amount (volume fraction) of superconducting phase was the largest at x=0.9 and y=0.1.

Figure 3:
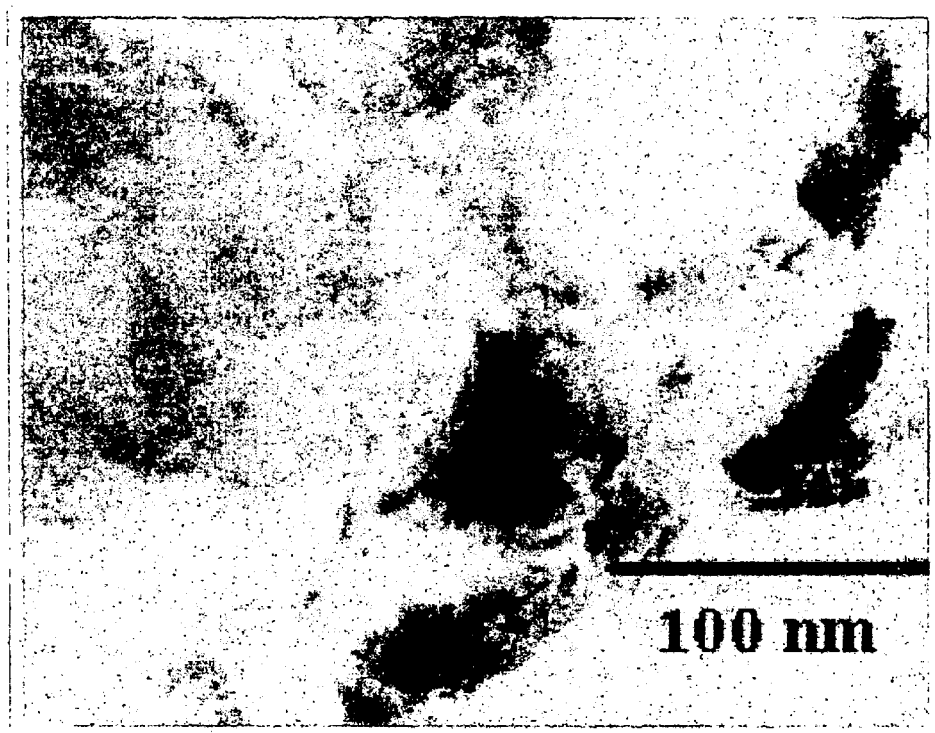
FIG. 3 is a transmission electron micrograph of an $MgB_2$-based superconductor obtained in the examples (x=0.9 and y=0.1 in an atomic ratio of Mg:B:Ti=x:2:y).

FIG. 3 is an HRTEM photograph (transmission electron micrograph) of the MgB$_2$-based superconductor obtained by adding titanium (x=0.9 and y=0.1 in an atomic ratio of Mg:B:Ti=x:2:y).

In FIG. 3, the portion that appears black is the dispersed titanium phase, while the other portion that appears brighter is the MgB$_2$ crystal phase.

Next, the superconducting characteristics were tested for the various MgB$_2$-based superconductors obtained above.

Figure 4:
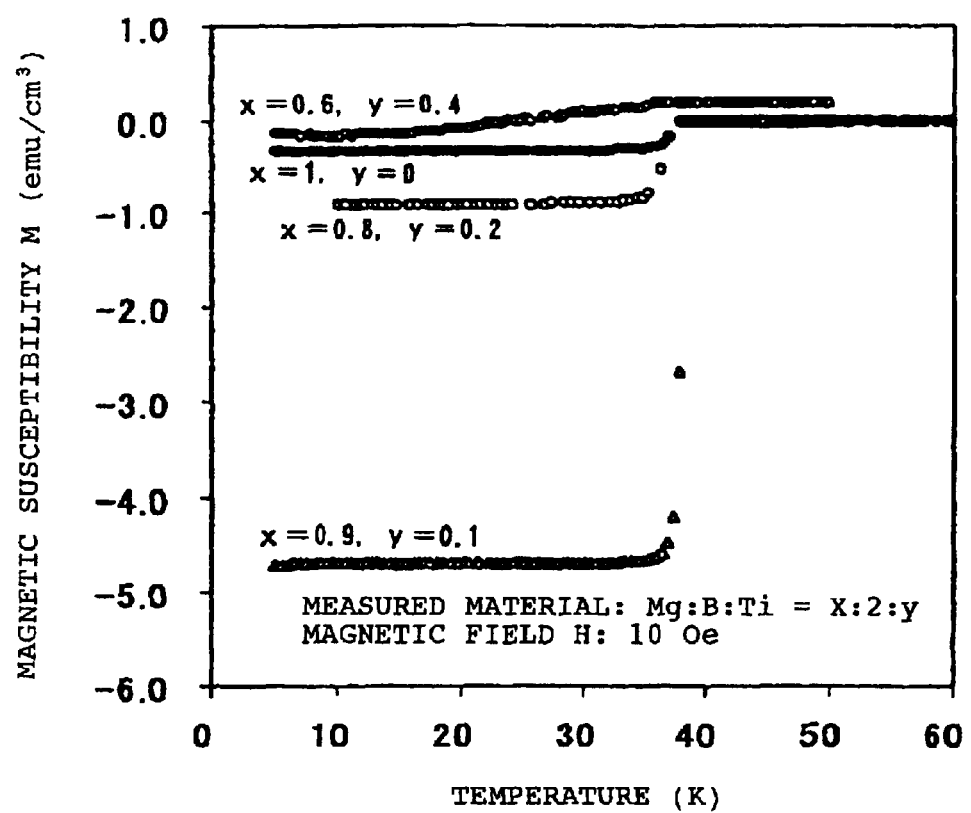
FIG. 4 is a graph of the results of measuring the temperature dependence of magnetic susceptibility in $MgB_2$-based superconductors obtained in the examples (when x=1 and y=0, when x=0.9 and y=0.1, when x=0.8 and y=0.2, and when x=0.6 and y=0.4 in an atomic ratio of Mg:B:Ti=x:2:y).

First, FIG. 4 is a graph of the results of measuring the temperature dependence of magnetic susceptibility (cooling in a zero magnetic field) in the obtained MgB$_2$-based superconductors (when x=1 and y=0, when x=0.9 and y=0.1, when x=0.8 and y=0.2, and when x=0.6 and y=0.4), and it can be seen that all of the superconductors exhibited a high critical temperature $T_c$ value between 37.5 and 38.6K.

Figure 5:
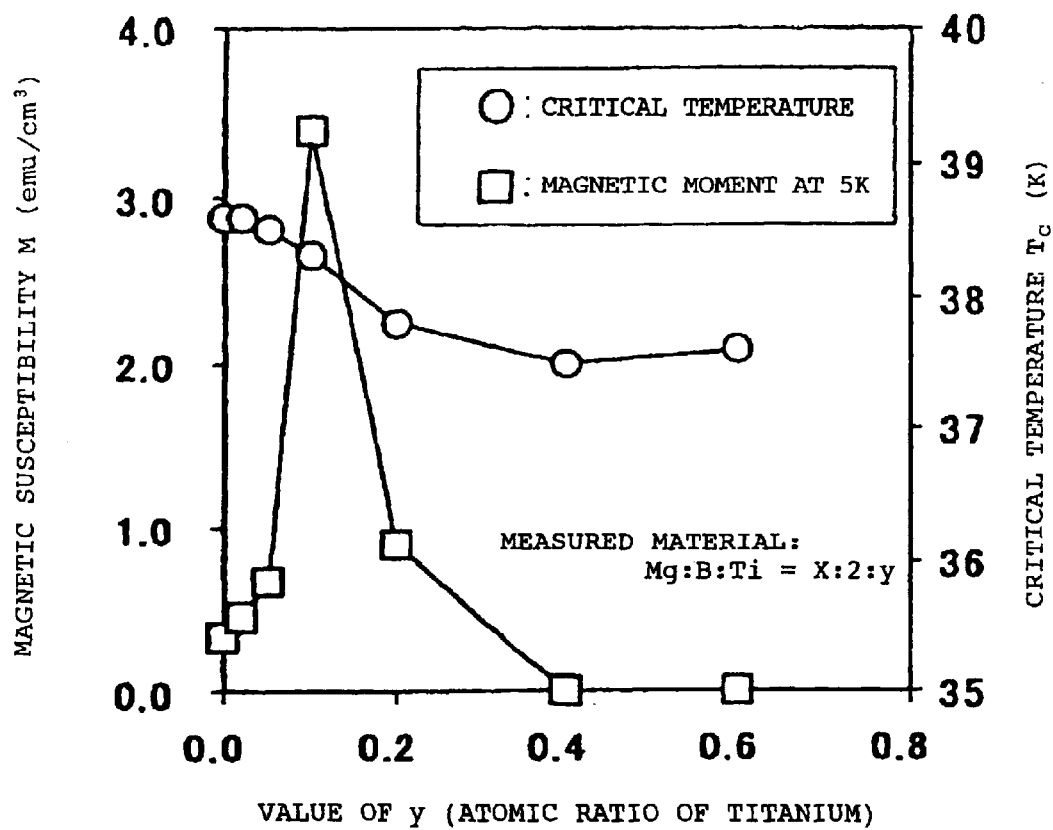
FIG. 5 is a graph of the relationship between the titanium content of an $MgB_2$-based superconductor obtained in the examples (the value of y in an atomic ratio of Mg:B:Ti=x:2:y), the magnetic susceptibility M, and the critical temperature $T_c$.

FIG. 5 is a graph of the results of examining the titanium atomic ratio (y), the magnetic susceptibility M, and the critical temperature $T_c$. It can be seen that when the value of y is within the range of 0.05<y<0.3, a high magnetization is exhibited without any substantial adverse effect on the critical temperature $T_c$.

Figure 6:
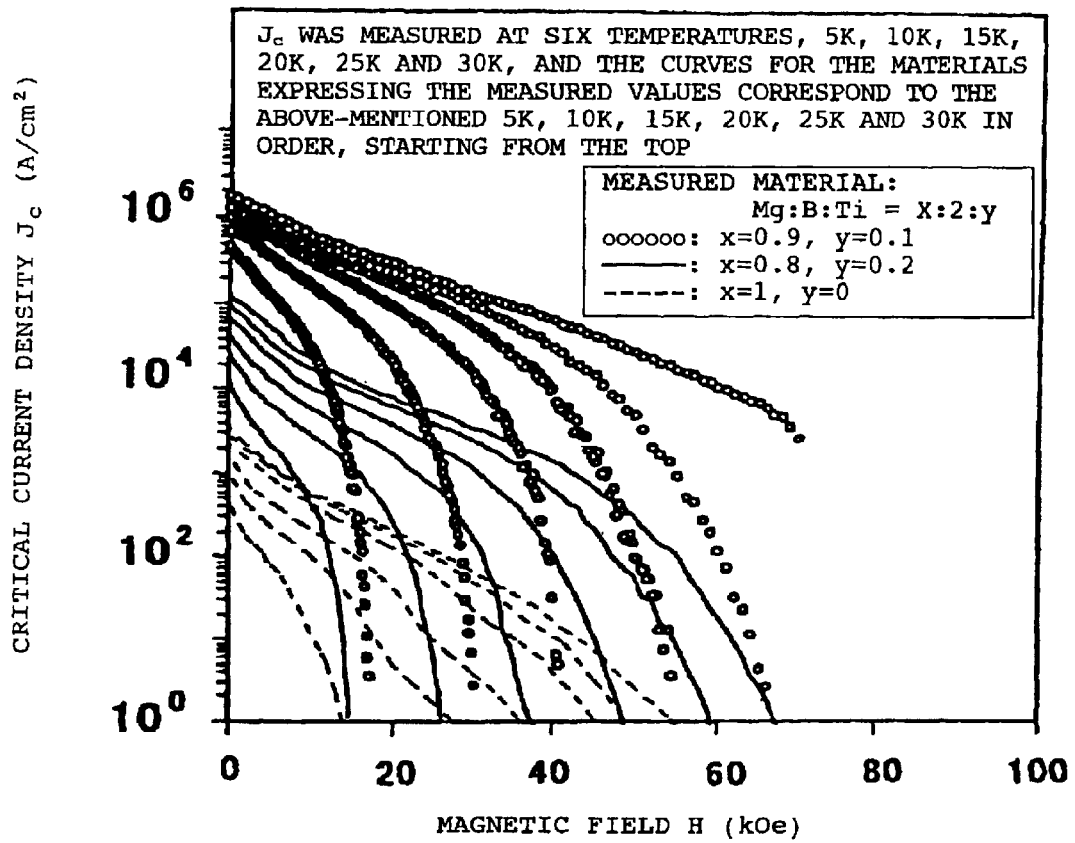
FIG. 6 is a graph of the magnetic field dependence of the critical current density $J_c$ at various temperatures for $MgB_2$-based superconductors obtained in the examples (when x=0.9 and y=0.1, when x=0.8 and y=0.2, and when x=1 and y=0 in an atomic ratio of Mg:B:Ti=x:2:y).

FIG. 6 is a graph of the magnetic field dependence of the critical current density $J_c$ at various temperatures for the obtained MgB$_2$-based superconductors (when x=0.9 and y=0.1, when x=0.8 and y=0.2, and when x=1 and y=0). It can be seen that compared to a material in which y=0 (a material containing no titanium), a material in which x=0.9 and y=0.1 and a material in which x=0.8 and y=0.2 exhibit far higher critical current density $J_c$ values.

Table 1 is a compilation of the results of measuring the critical current density $J_c$ at various temperatures and magnetic fields for the MgB$_2$-based superconductors obtained in the examples (when x=0.9 and y=0.1).

TABLE 1

Results of measuring critical current density

| Temperature (K) | Magnetic field (T) | Critical current density (A/cm$^2$) |
|---|---|---|
| 5 | 0 | 2 × 10$^6$ |
| 5 | 2 | 3 × 10$^5$ |
| 5 | 5 | 5 × 10$^4$ |
| 20 | 0 | 1.3 × 10$^6$ |
| 20 | 1 | 3.1 × 10$^5$ |
| 20 | 2 | 9.4 × 10$^4$ |
| 20 | 3 | 1.7 × 10$^4$ |
| 35 | 0 | 1.2 × 10$^5$ |

Figure 7:
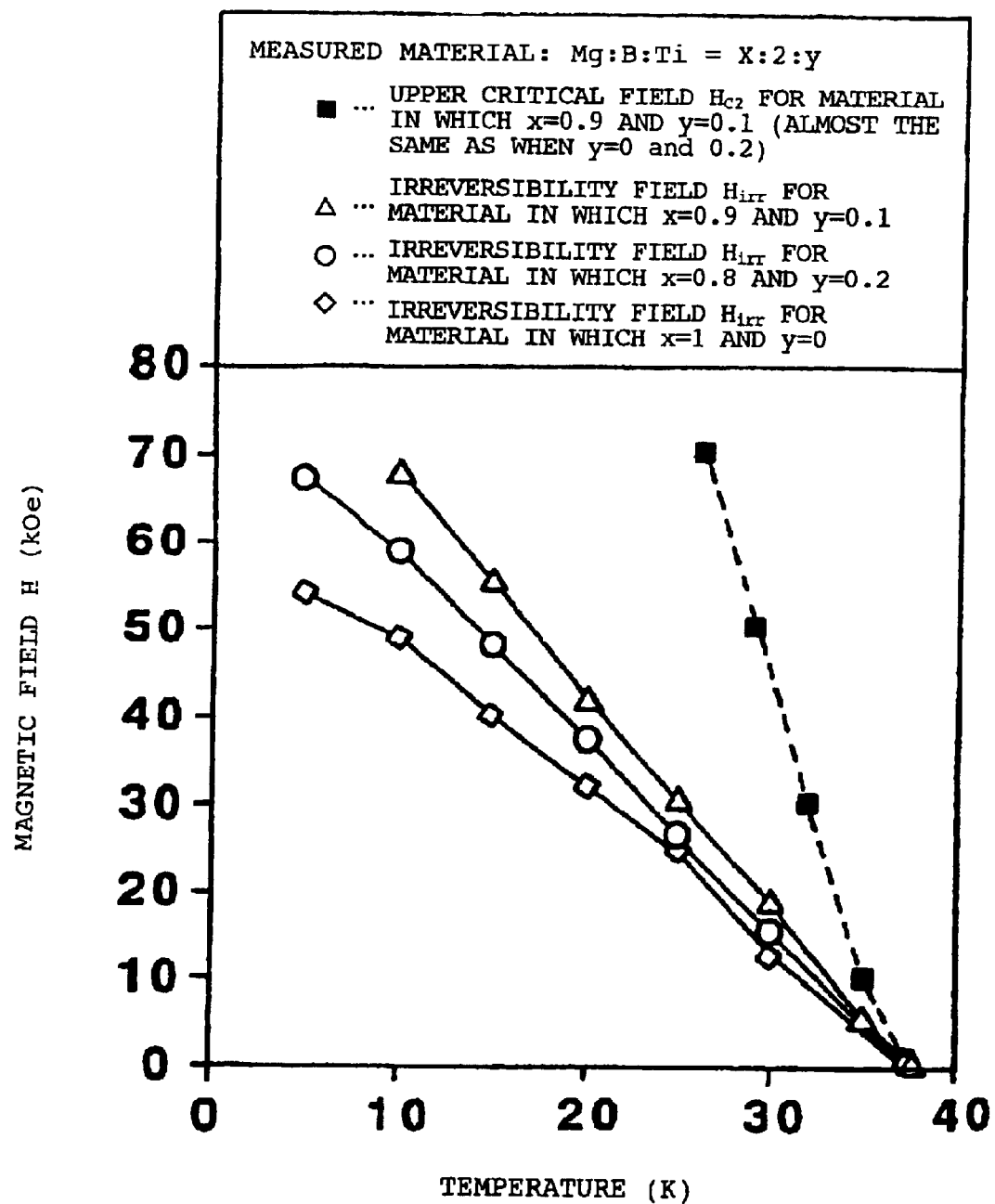
FIG. 7 is a graph of the temperature dependence of the irreversibility field $H_{irr}$ and the upper critical field $H_{c2}$ for each MgB$_2$-based superconductor obtained in the examples (when x=0.9 and y=0.1, when x=0.8 and y=0.2, and when x=1 and y=0 in an atomic ratio of Mg:B:Ti=x:2:y).

FIG. 7 is a graph of the temperature dependence of the irreversibility field $H_{irr}$ and the upper critical field $H_{c2}$ for MgB$_2$-based superconductors obtained in the examples (when x=0.9 and y=0.1, when x=0.8 and y=0.2, and when x=1 and y=0). It can be seen that compared to a material in which y=0 (a material containing no titanium), a material in which y=0.1 or y=0.2 exhibits an irreversibility field $H_{irr}$ that is closer to the upper critical field $H_{c2}$.

Therefore, the MgB$_2$-based superconductor according to the present invention has a far wider magnetic field region over which superconducting current can flow than does a material containing no titanium, and is a superior superconductor material in this respect as well.

The data for the upper critical field $H_{c2}$ given in FIG. 7 was measured from a magnetization M-H curve at different temperatures for a material in which y=0.1, but the data for $H_{c2}$ measured for samples in which y=0, 0.05, and 0.2 was almost the same as that of the sample in which y=0.1.

INDUSTRIAL APPLICABILITY

As described above, according to the novel manufacturing method of the present invention, a dense MgB$_2$-based superconductor that exhibits high critical current density, which could only be obtained in the past by sintering in a high-pressure atmosphere, can be manufactured in a low-pressure atmosphere as low as atmospheric pressure, so superconductor wire materials, superconductor bulk materials, and so on for application to electric power cables, magnets, motors, generators, and so forth can be mass produced at a low cost. Therefore, the present invention is extremely useful industrially in that it can provide high-quality superconductors stably at a low price.

What is claimed is:

1. An MgB$_2$-based superconductor with high critical current density, wherein either titanium or a titanium compound or both thereof is dispersed in an MgB$_2$-based sintered body and the amounts of magnesium, boron, and titanium contained in the sintered body are expressed as an atomic ratio of Mg:B:Ti of x:2:y, with 0.7x<1.2 and 0.05<y<0.3.

2. The MgB$_2$-based superconductor with high critical current density according to claim 1, wherein either the titanium or the titanium compound or both thereof is present at the $MgB_2$ crystal grain boundary.

3. The $MgB_2$-based superconductor with high critical current density according to claim 1, wherein x and y are such that 0.7<x<1.2 and 0.07<y<0.2.

4. The $MgB_2$-based superconductor with high critical current density according to claim 1, wherein the superconductor has a critical current density of at least $5 \times 10^5$ A/cm$^2$ at a temperature of 20K and in a self field.

5. The $MgB_2$-based superconductor with high critical current density according to claim 1, wherein the superconductor has a critical current density of at least $2 \times 10^5$ A/cm$^2$ at a temperature of 20K and in a magnetic field of 1 T.

6. A method for manufacturing the $MgB_2$-based superconductor with high critical current density according to claim 1, the method comprising compacting a mixture of magnesium, boron, and titanium and sintering the pressed mixture.

7. A method for manufacturing the $MgB_2$-based superconductor with high critical current density according to claim 1, the method comprising forming a mixture of magnesium, boron, and titanium into a wire and firing the wire.

8. A method for manufacturing the $MgB_2$-based superconductor with high critical current density according to claim 1, the method comprising sintering a mixture of magnesium, boron, and titanium, pulverizing the sintered mixture to powder, forming the sintered powder into a wire and firing the wire.

9. The method for manufacturing the $MgB_2$-based superconductor with high critical current density according to claim 6, wherein the sintering is performed under an atmospheric pressure.

10. The method for manufacturing the $MgB_2$-based superconductor with high critical current density according to claim 6, wherein the sintering is performed at a temperature of at least 600° C.

11. The $MgB_2$-based superconductor with high critical current density according to claim 1, wherein x is 0.9 and y is 0.1.

12. The $MgB_2$-based superconductor with high critical current density according to claim 1, wherein x is 0.8 and y is 0.2.

* * * * *